United States Patent [19]

Etherington et al.

[11] Patent Number: 4,999,271

[45] Date of Patent: Mar. 12, 1991

[54] PRINTING PLATE PRECURSORS

[75] Inventors: Terence Etherington, Roundhay; Keith M. Fletcher, Oakwood; Rodney M. Potts, Adel; John R. Wade, Otley, all of England

[73] Assignee: Vickers PLC, London, England

[21] Appl. No.: 298,221

[22] Filed: Jan. 17, 1989

Related U.S. Application Data

[63] Continuation of Ser. No. 96,893, Sep. 15, 1987, abandoned.

[30] Foreign Application Priority Data

Sep. 16, 1986 [GB] United Kingdom ............... 8622266

[51] Int. Cl.$^5$ .................................. G03F 7/028
[52] U.S. Cl. ..................... 430/284; 430/278; 430/300; 522/97; 522/174
[58] Field of Search ............ 430/278, 284, 300; 522/97, 174

[56] References Cited

U.S. PATENT DOCUMENTS

| | | |
|---|---|---|
| 3,759,809 | 9/1973 | Carlick et al. ............... 522/174 |
| 3,840,369 | 10/1974 | Carlick et al. |
| 3,850,770 | 11/1974 | Juna et al. ................... 430/284 |
| 3,864,133 | 2/1975 | Hisamatsu .................. 430/284 |
| 4,250,248 | 2/1981 | Faust ........................... 430/284 |
| 4,380,604 | 4/1983 | Neuhaus et al. |
| 4,458,007 | 7/1984 | Geissler et al. ............. 430/284 |
| 4,587,201 | 5/1986 | Morikawa .................... 430/284 |
| 4,652,604 | 3/1987 | Walls et al. .................. 522/63 |

FOREIGN PATENT DOCUMENTS 0054700 12/1980 European Pat. Off. ............ 430/284
2459420 12/1974 German Democratic Rep. ... 522/97

Primary Examiner—Marion E. McCamish
Assistant Examiner—Christopher D. RoDee
Attorney, Agent, or Firm—Reed Smith Shaw & McClay

[57] ABSTRACT

A printing plate precursor comprises a substrate coated with a radiation sensitive composition comprising a photoinitiator and a photopolymerizable urethane acrylate or methacrylate. The urethane acrylate or methacrylate is produced by partial acrylation or methacrylation of a tetrafunctional polyol and the remaining hydroxy groups of the polyol are reacted with a di or polyisocyanate.

11 Claims, No Drawings

PRINTING PLATE PRECURSORS

This is a continuation of co-pending application Ser. No. 07/096,893 filed on 9/15/87 now abandoned.

This invention relates to printing plate precursors and is concerned with such precursors which comprise a substrate coated with a radiation sensitive composition. Whilst being particularly concerned with lithographic plate precursors, the invention is also applicable to precursors for flexographic plates.

In use of such precursors, the radiation sensitive composition is image-wise exposed to radiation so that parts are struck by the radiation and parts are not. The radiation struck parts and the nonradiation struck parts have differing solubilities in developer liquids. Thus the more soluble of these parts can be selectively removed by the application of such a developer liquid to leave a printing image on the substrate constituted by the less soluble parts.

As is well known, printing plate precursors and similar radiation sensitive articles are considered to be either negative working or positive working depending on the effect of actinic radiation on the radiation sensitive composition.

In the past, most negative-working compositions for printing plate precursors have been based on photocrosslinkable compounds (e.g. cinnamate type materials) or on the so-called "diazo resins". The former type have the disadvantage of needing to be developed in an organic solvent developer liquid and the latter have the disadvantage of having a shorter printing life. Both types are also limited as regards their exposure speed.

More recently, there has been a trend towards using radiation sensitive compositions based on compounds containing ethylenic unsaturation (hereafter referred to as prepolymers), which polymerise on exposure to actinic radiation. Precursors using such compounds have the advantage that, whilst having the potential to be developed in aqueous-based developer liquids in a similar manner to diazo resin based precursors, they are also capable of much longer printing life than photo-crosslinkable or diazo resin based precursors and, moreover, they have exposure speeds which are many times greater. However, there are drawbacks to the use of such prepolymers. Commonly, the unsaturated groups are in the form of low molecular weight acrylates which can involve health and safety problems. Also, highly sensitive pre-polymer based precursors can have problems in respect of the storage life necessary for a presensitised precursor in that if they are stored for any length of time before exposure and development they cannot be developed using aqueous-based developers.

It is an object of the present invention to provide printing plate precursors which, whilst retaining high sensitivity, have improved aqueous developability characteristics after storage and pose less risks in terms of health and safety.

According to one aspect of the present invention, there is provided a printing plate precursor comprising a substrate coated with a radiation sensitive composition which composition comprises at least one photoinitiator and at least one photopolymerisable compound which is an acrylic or methacrylic ester of a tetra functional polyol having the general formula:

$$C(CH_2O)_4(C_3H_6O)_nH_4$$

wherein the average degree of propoxylation n is from 3 to 6, from 50% to 90% of the available hydroxy groups . have been converted to acrylate or methacrylate groups, and the remaining hydroxy groups have been reacted with a di-isocyanate or a polyisocyanate.

According to another aspect of the present invention there is provided a method of producing a printing plate precursor which method comprises (i) forming a urethane acrylate or urethane methacrylate by converting from 50 to 90% of the available hydroxy groups of a tetra functional polyol having the general formula:

$$C(CH_2O)_4(C_3H_6O)_nH_4,$$

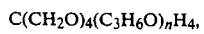

wherein the average degree of propoxylation n is from 3 to 6, into acrylate or methacrylate groups and reacting the remaining available hydroxy groups with a diisocyanate or polyisocyanate;

(ii) admixing the urethane acrylate or urethane methacrylate with a photoinitiator to form a radiation sensitive composition, and (iii) forming a coating of the composition on a substrate.

The polyol may be obtained by reacting pentaerythritol with an oxypropylating agent, for example propylene oxide and/or propylene carbonate. The (meth)acrylation may be carried out by an acid catalysed (e.g. sulphuric acid) azeotropic esterification reaction in the presence of a product to inhibit premature polymerisation of the (meth)acrylate groups (for example copper oxide). Reaction of the remaining hydroxy groups of the resultant hydroxy poly(meth)acrylate with the isocyanate may be effected by treating the poly(meth)acrylate with the isocyanate in the presence of a suitable catalyst, for example an alkyl tin compound and/or a tertiary amine. Optionally, an organic, non-protonic solvent, such as toluene or butanone, may also be present.

In accordance with an embodiment of the invention, the di-isocyanate or polyisocyanate is reacted, either simultaneously or successively, with both a compound having at least two active hydrogen containing groups and also the hydroxy poly(meth)acrylate described above.

The active hydrogen-containing group may be a hydroxy group, a carboxy group, a mercapto group or an amino group and particularly preferred compounds containing such groups are polyethylene glycol, polypropylene glycol, 2-(ethylamino)ethanol, butan-1,3-diol, polycaprolactone based diols, 3,6-dithiaoctan-1,8-diol, lactic acid or thiosalicylic acid.

Whilst any di- or poly-isocyanate can be used, 2, 4 and 2, 6 toluene diisocyanate, diphenyl methane diisocyanate, hexamethylene diisocyanate, isophorone diisocyanate and isophorone diisocyanate trimer are particularly suitable.

Preferred photoinitiators for the radiation sensitive composition are triazines such as 2,4,6-tris trichloromethyl-s-triazine; ketones such as benzoins, benzoin ethers, benzophenone or Michler's ketone; peresters as referred to in European Patent (EP) Specification No. 125140, such as 4-benzoyl-t-butyl perbenzoate; (trichloromethyl)phenacylidene N-heterocyclic derivatives as referred to in EP No. 135348, such as 1,3,3-trimethyl-2-(4'trichloromethylbenzoyl)methylene 5-chloroindoline; acridine compounds such as 9-phenyl acridine; and polynuclear quinones such as 2-ethyl anthraquinone and 2-isopropyl thioxanthone. The photoinitiator may be present in an amount of from 0.01-50% (preferably 0.1-15%) by weight of the urethane (meth)acrylate).

If required an optical sensitiser may be included in the composition to broaden or alter its spectral response. Examples of suitable optical sensitiser are coumarins and bis coumarins (GB Patent No. 1 578 662, U.S. Pat. No.4,147,552 and EP No. 22188); α, β-unsaturated ketones (GB Patent No.1 553 823, U.S. Pat. Nos. 3,652,275, 4,162,161 and 4,268,667 and GB Published Application No. 2 006 775); methine dyes (GB Patent No. 1 566 405, U.S. Pat. No. 2,732,301 and GB published patent Application No. 2 064 546); and pyrylium dyes (GB Patent Nos. 1 023 377 and 1 566 405 and U.S. Pat. Nos. 3,907,561 and 900,031). The sensitiser may be present in an amount of from 0.01 to 50% (preferably 0.1 to 15%) by weight of the urethane (meth)acrylate).

If required, a binder resin may be incorporated in the radiation sensitive composition to provide greater strength and improve the adherence of the composition to the substrate. Typical binders are acrylic polymers, vinyl acetate polymers, polyurethanes, novolak resins, polyamides, polyvinyl esters, polyvinyl acetals, polyvinyl ethers, epoxide resins, styrene maleic anhydride copolymers, polymethacrylates, polyesters, alkyd resins, polyacrylamides, polyvinyl alcohol, polyethylene oxide, polydimethylacrylamide, polyvinylpyrrolidone, polyvinylmethylformamide and polyvinylmethyl-acetamide. It is particularly preferred to use binder resins which are at least swellable in aqueous-alkaline solutions. Many other examples of suitable binders are listed in the patent literature and reference may be made, for example, to U.S. Pat. Nos. 3,652,275, 4,268,667, 4,458,007 and GB published patent application No.2 006 775. The binder resin may be present in an amount of from 0-500% (preferably 0-250%) by weight of the urethane (meth)acrylate).

The substrate may be any substrate conventionally used for printing plate precursors, such as paper, plastics material, or metal. A substrate formed of grained and anodised aluminium is particularly preferred for a lithographic plate precursor and a substrate formed of polyfibron, steel or aluminium is preferred for a flexographic plate precursor.

The radiation sensitive composition may also include a substance which exhibits a colour change when the composition is exposed to radiation. Thus the substance may be a dye, a dye precursor, an indicator which becomes bleached or otherwise changes colour in the presence of acid, or a leuco dye which is caused to become coloured by oxidation as a consequence of the exposure of the composition to radiation.

Such colour changes are particularly important in the production of lithographic and flexographic printing plates from radiation sensitive plates since they provide a visible distinction between the image and the non-image area after image-wise exposure and this allows defects to be noticed before the plate is developed.

The polymerisation of ethylenically unsaturated compounds is inhibited by the presence of oxygen. It is, therefore, desirable to overcoat the radiation sensitive composition with a barrier layer which is transparent to radiation and also impervious to oxygen. A layer of polyvinyl alcohol is particularly suitable for this purpose and it may be applied by a roller coater.

The following Examples illustrate the invention.

EXAMPLE 1

An electrolytically grained and anodised aluminium sheet was whirler coated with a solution, in ethyl methyl ketone, of a radiation sensitive composition comprising:

2 parts by weight of Prepolymer A
1 part by weight of a vinyl acetate/crotonic acid copolymer
0.15 parts by weight of 2,4,6-tris(trichloromethyl)-s-triazine
0.15 parts by weight Ethyl Michler's Ketone, and
0.15 parts by weight Leuco Crystal Violet The coating weight was 1 g/sq. meter. After drying, an overcoating of poly(vinyl alcohol) was applied by roller coater to prevent oxygen inhibition. The resultant radiation sensitive plate was exposed through a continuous tone Stouffer step-wedge to ultraviolet light (30 units) from a Berkey Ascor printing down frame and developed with an aqueous solution containing sodium propionate, sodium benzoate and a surfactant. The developed image of the resultant lithographic printing plate had a step-wedge of solid 4 tail 9.

Prepolymer A is the reaction product of toluene di-isocyanate and a polyol of the above general formula wherein n=3.7 and approximately 75% of the free hydrogen groups have been acrylated. It may be prepared as follows:

A mixture of 122 g of pentaerythritol, 193.5 g of propylene oxide and 3 g of triethylamine was heated in an autoclave to 90 degC. The temperature was controlled between 90° C. and 105° C. until essentially all the propylene oxide had reacted, as evidenced by a significant reduction in pressure. A pale coloured transparent liquid of low viscosity was obtained.

A mixture of 40 g of the above propoxylated pentaerythritol, 30.2 g acrylic acid, 0.4 g of copper (I) oxide and 1.2 cm$^3$ conc. H$_2$SO$_4$ in toluene (150 cm$^3$) was heated with stirring in the presence of a Dean and Stark trap. The reaction was allowed to continue until 6.1 cm$^3$ of water had been liberated. The mixture was then cooled and washed with 20% w/v aqueous sodium chloride (2×50 cm$^3$ aliquots), then with 15% w/v aqueous potassium bicarbonate (2×100 cm$^3$ aliquots) and finally a further wash with 20% w/v aqueous sodium chloride (2×50 cm$^3$ aliquots). The resulting solution was then filtered and dried over anhydrous sodium sulphate. The solvent was then removed leaving the polyacrylate product as a colourless oil to which 0.2% w/w of 4-methoxyphenol, a polymerisation inhibitor, was then added.

A mixture of 68.9 g of the polyacrylate, 8.7 g of commercial quality toluene di-isocyanate, 0.1 g dibutyl tin dilaurate and 0.1 g triethylene diamine were heated with stirring to 50 degC in a moisture-free atmosphere. The reaction was allowed to proceed until all the isocyanate had reacted as determined by IR spectroscopy. The product, Prepolymer A, was a transparent, viscous liquid.

EXAMPLE 2

Using the method described in Example 1 and altering the proportion of propylene oxide relative to pentaerythritol (to vary the degree of propoxylation), altering the amount of (meth)acrylic acid, continuing the reaction until the correct degree of esterification has been achieved as indicated by the amount of water liberated (to vary the ester group and the degree of esterification) and utilising an appropriate isocyanate, prepolymers B to J were prepared as shown in Table I. The prepolymers were then incorporated in radiation sensitive compositions and radiation sensitive plates were prepared and processed as in Example 1. The compositions and the resulting sensitivities thereof are shown in Table II.

TABLE I

| Pre-polymer | Degree of Propoxylation | Ester Group | Degree of Esterification | Isocyanate |
|---|---|---|---|---|
| A | 3.7 | Acrylate | 75% | I |
| B | 3.7 | Methacrylate | 75% | I |
| C | 4.7 | Acrylate | 75% | I |
| D | 4.7 | Methacrylate | 75% | I |
| E | 4.7 | Acrylate | 90% | II |
| F | 4.7 | Acrylate | 50% | III |
| G | 4.7 | Acrylate | 75% | IV |
| H | 5.5 | Acrylate | 75% | I |
| I | 5.5 | Methacrylate | 90% | II |
| J | 5.5 | Acrylate | 75% | V |

The isocyanate used were as follows:
I = Toluene diisocyanate
II = Poly[methylene(poly phenyl isocyanate)]
III — Phenyl isocyanate
IV — Isophorone diisocyanate
V — Hexamethylene diisocyanate

TABLE II

| Formulation | 67% Prepolymer | 33% Binder Resin | 5% Photoinitiator | 5% Sensitiser | Sensitivity |
|---|---|---|---|---|---|
| 1 | A | I | I | I | 4,9 |
| 2 | A | I | II | — | 6,11 |
| 3 | A | I | I | II | 2,6 |
| 3 | A | I | I | III | 1,5 |
| 5 | A | I | III | I | 5,11 |
| 6 | A | I | IV | I | 0,4 |
| 7 | A | III | II | — | 7,12 |
| 8 | B | III | II | — | 6,10 |
| 9 | C | III | II | — | 7,13 |
| 10 | D | III | II | — | 6,12 |
| 11 | E | III | II | — | 5,9 |
| 12 | F | III | II | — | 8,13 |
| 13 | G | III | II | — | 6,10 |
| 14 | H | III | II | — | 7,12 |
| 15 | I | III | II | — | 5,11 |
| 16 | J | III | II | — | 4,9 |
| 17 | C | II | II | — | 8,14 |
| 18 | C | II | III | I | 7,13 |
| 19 | C | IV | III | I | 6,12 |
| 20 | C | V | III | I | 3,7 |
| 21 | C | VI | III | I | 5,10 |

The binder resins, photoinitiators and sensitisers used were as follows:
I = Vinyl acetate/crotonic acid copolymer (acid value 80)
II = Phthaloylated poly(vinyl butyral) (acid value 80)
III = N-t-Octylacrylamide/acrylic acid/methyl methacrylate/hydroxypropyl methacrylate/t-butylaminomethacrylate polymer
IV = n-hexylmethacrylate/methacrylic acid/styrene terpolymer (Acid value 120)
V = styrene maleic anhydride ester co-polymer (acid value 200)
VI = p-tolylsulphonyl carbamate modified poly(vinyl butyral)
Photoinitiators
I = 2,4,6-tris(trichloromethyl)-s-triazine
II = 4'-trichloromethyl phenacrylidene-1,3,3,-trimethyl-5-chloro indolenine
III = Benzophenone-4-t-butyl benzoate
IV = 9-phenyl acridine
Sensitisers
I = Ethyl Michler's ketone
II = 2-benzoylmethylene-3-methyl benzo thiazole
III = 3-methyl-7-diethylamino coumarin

EXAMPLE 3

Example 1 was repeated except that the Prepolymer A was replaced by Prepolymer K in which the free hydroxy groups were reacted with toluene diisocyanate end-capped polypropylene glycol.

Similar results were obtained.

Prepolymer K may be prepared in the same way as Prepolymer A except that in the final reaction, 26.5 g of the polyacrylate is used and 10.62 g of polypropylene glycol 425 is added to the reaction mixture.

EXAMPLE 4

Example 1 was again repeated using as the prepolymer Prepolymer L which may be prepared by further reacting the polyacrylate as follows.

A mixture of 68.9 g of the polyacrylate, 10.0 g of commercial toluene diisocyanate and 0.1 g of dibutyl tin dilaurate were heated to 90° C. for 16 hours in a moisture free atmosphere. 1.15 g of thiosalicylic acid were then added and the reaction continued at 90° C. until all the isocyanate had reacted as determined by i/r spectroscopy. The product was a highly viscous liquid.

Similar results were obtained.

EXAMPLE 5

A polyfibron substrate was curtain coated with a solution in ethyl methyl ketone of a radiation sensitive composition comprising:

0.75 parts by weight Prepolymer A
1 part by weight of a vinyl acetate/crotonic acid copolymer
0.05 parts by weight of 2,4,6-tris(trichloromethyl)-s-triazine, and
0.01 parts by weight Ethyl Michler's Ketone.

The coating weight was 300 g/sq. meter. After coating with poly(vinyl alcohol), the plate was exposed through a line negative to ultra-violet light and developed as in Example 1.

A flexographic plate having a 300 micron relief image was obtained.

EXAMPLE 6

A plate based on Formulation 18 of Table II (containing Prepolymer C) was subjected to a rapid ageing test by being stored at 30° C. and 90% relative humidity in a cabinet. The plate was removed at intervals of 1 week from the cabinet and processed as in Example 1 until it failed to develop cleanly. The experiment was repeated with Prepolymer C replaced with various other commercially available prepolymers. The results are shown in Table III as a percentage of the stability of Formulation 18.

Further identical plates were made and press tested on a web-offset printing press. The results obtained are also shown in Table III as percentage of the run length of Formulation 18.

| Prepolymer | Type | Stability (% of Formulation 18) | Run length (% of Formulation 18) |
|---|---|---|---|
| Ebecryl 220 | Hexa functional aromatic urethane acrylate | 33 | 80 |
| Genomer T1200 | Trifunctional polyester based urethane acrylate | 40 | 85 |
| Synocure E2778 | Epoxyacrylate | 70 | 65 |
| Laromer PE55F | Polyester acrylate | 40 | 80 |
| | Glyceryl diacrylate/ Desmodur-N urethane tetra acrylate | 35 | 95 |

I claim:

1. A printing plate precursor comprising a substrate coated with a radiation sensitive composition which composition comprises at least one photoinitiator and at least one photopolymerisable compound which is an acrylic or methacrylic ester of a tetra functional polyol having the general formula:

$$C(CH_2O)_4(C_3H_6O)_nH_4$$

wherein the average degree of propoxylation n is from 3 to 6, from 50% to 90% of the available hydroxy groups have been converted to acrylate or methacrylate groups, and the remaining hydroxy groups have been reacted with a di-isocyanate or a polyisocyanate.

2. A printing plate precursor as claimed in claim 1 wherein the photoinitiator is a triazine, a ketone, a perester or an acridine.

3. A printing plate precursor as claimed in claim 1 wherein the composition comprises an acrylic polymer, a vinyl acetate polymer, a styrene-maleic anhydride copolymer, or a poly(vinyl acetal) as a binder resin.

4. A printing plate precursor as claimed in claim 1, wherein the composition includes a coumarin or bis coumarin, an α,β-unsaturated ketone, a methine dye or a pyrilium dye as an optical sensitiser.

5. A printing plate precursor as claimed in claim 1 wherein the substrate is formed of aluminium.

6. A method of producing a printing plate precursor which method comprises
   (i) forming a urethane acrylate or urethane methacrylate by converting from 50 to 90% of the available hydroxy group of a tetra functional polyol having the general formula:

$$C(CH_2O)_4(C_3H_6O)_nH_4,$$

wherein the average degree of propoxylation n is from 3 to 6, into acrylate or methacrylate groups and reacting the remaining available hydroxy groups with a diisocyanate or polyisocyanate;
   (ii) admixing the urethane acrylate or urethane methacrylate with a photoinitiator to form a radiation sensitive composition, and
   (iii) forming a coating of the composition on a substrate.

7. A method according to claim 6 wherein the diisocyanate or polyisocyanate is additionally reacted with a compound having at least two groups which contain an active hydrogen atom.

8. A method according to claim 7 wherein said compound is polyethylene glycol; polypropylene glycol; 2-ethylamino ethanol; butan-1,3-diol; a polycaprolactone based diol; 3,6-dithiaoctan-1,8-diol, lactic acid or thiosalicylic acid.

9. A method according to claim 6, wherein the diisocyanate or polyisocyanate is 2,4 toluene diisocyanate; 2,6 toluene diisocyanate, diphenyl methane diisocyanate; hexamethylene diisocyanate; isophorone diisocyanate, or isophorone diisocyanate trimer.

10. A printing plate precursor as claimed in claim 1 wherein the photoinitiator is a polynuclear quinone.

11. A method of producing a printing plate precursor comprising the steps of:
   (i) forming a photopolymerisable compound by
      (a) providing a tetra functional polyol having a general formula:

$$C(CH_2O)_4(C_3H_6O)_nH_4$$

wherein n is from 3 to 6.
      (b) converting from 50% to 90% of available hydroxy groups of said tetra functional polyol to acrylate or methacrylate groups, and
      (c) reacting any unconverted hydroxy groups with a di-isocyanate or a polyisocyanate to form said photopolymerisable compound;
   (ii) admixing the photopolymerisable compound with a photoinitiator to form a radiation sensitive composition; and
   (iii) forming a coating of said radiation sensitive composition on a substrate.

* * * * *